(12) United States Patent
Iinuma et al.

(10) Patent No.: US 9,050,791 B2
(45) Date of Patent: Jun. 9, 2015

(54) LIQUID DISCHARGE HEAD AND METHOD FOR MANUFACTURING THE SAME

(71) Applicant: CANON KABUSHIKI KAISHA, Tokyo (JP)

(72) Inventors: Keisuke Iinuma, Yokohama (JP); Hiromasa Amma, Kawasaki (JP); Kyosuke Toda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/934,317

(22) Filed: Jul. 3, 2013

(65) Prior Publication Data

US 2013/0293636 A1 Nov. 7, 2013

Related U.S. Application Data

(63) Continuation of application No. 13/356,261, filed on Jan. 23, 2012, now Pat. No. 8,500,250.

(30) Foreign Application Priority Data

Jan. 25, 2011 (JP) ................................. 2011-013276

(51) Int. Cl.
*B41J 2/16* (2006.01)
*B41J 2/05* (2006.01)
*B41J 2/01* (2006.01)
*B41J 2/175* (2006.01)

(52) U.S. Cl.
CPC .............. *B41J 2/01* (2013.01); *Y10T 29/49117* (2015.01); *B41J 2/1753* (2013.01); *B41J 2/17553* (2013.01)

(58) Field of Classification Search
CPC ... B41J 2/1753; B41J 2/17553; B41J 2/14072

USPC ..................... 347/50, 57, 58, 59, 61
See application file for complete search history.

(56) References Cited

U.S. PATENT DOCUMENTS

| | | | |
|---|---|---|---|
| 7,810,907 B2 * | 10/2010 | Kubo et al. ..................... | 347/50 |
| 2006/0125881 A1 | 6/2006 | Kubo | |
| 2006/0232633 A1 | 10/2006 | Kubo | |
| 2007/0008382 A1 | 1/2007 | Hatsui | |
| 2007/0139480 A1 | 6/2007 | Yamaguchi | |
| 2007/0188559 A1 * | 8/2007 | Imanaka et al. ............... | 347/58 |
| 2009/0309929 A1 * | 12/2009 | Kanda et al. ................... | 347/50 |

FOREIGN PATENT DOCUMENTS

| | | | |
|---|---|---|---|
| CN | 1613648 A | | 5/2005 |
| JP | 2006-297753 A | | 11/2006 |
| JP | 2006297753 A | * | 11/2006 |

* cited by examiner

*Primary Examiner* — Jannelle M Lebron
(74) *Attorney, Agent, or Firm* — Canon USA Inc. IP Division

(57) ABSTRACT

A liquid discharge head includes: a recording element substrate and a plurality of electric connection units; and an electric wiring member that includes a plurality of input terminals, a plurality wirings held between films and electrically connected to the plurality of input terminals, and a plurality of lead lines conducted to the plurality of wirings. In this case, the plurality of wirings include a power line for supplying power to the energy generation elements and a signal line for supplying a signal to the energy generation elements. Relationships of A>B and B<D are satisfied, in which A is a largest width of the signal line, B is a largest width of the lead line connected to the signal line, and D is a largest width of the lead line connected to the power line.

5 Claims, 12 Drawing Sheets

LIQUID DISCHARGE HEAD AND METHOD FOR MANUFACTURING THE SAME

CROSS REFERENCE TO RELATED APPLICATIONS

This application is a Continuation of U.S. patent application Ser. No. 13/356,261 filed Jan. 23, 2012, which claims the benefit of Japanese Patent Application No. 2011-013276 filed Jan. 25, 2011, both of which are hereby incorporated by reference in their entirety.

BACKGROUND OF THE INVENTION

1. Field of the Invention

The present invention relates to a liquid discharge head that discharges a liquid such as ink to perform a recording operation, and a method for manufacturing the same.

2. Description of the Related Art

The liquid discharge head includes an external signal input terminal electrically connected to a recording apparatus body side to receive, from a recording apparatus body, an electric signal or power used for driving an energy generation element that generates energy used for discharging a liquid. To connect the external signal input terminal to a recording element substrate that includes the energy generation element, an electric wiring member including a flexible tape member is generally used. The electric wiring member, which is configured by sandwiching copper foil between base film and cover resin film and bonding and stacking each member, has a device hole that is an opening for installing the recording element substrate. Wiring of the electric wiring member including the copper foil can be classified into power lines and signal lines for driving the energy generation element. The power lines include a wiring for applying a driving voltage and a ground wiring of the driving voltage. The electric wiring member and the recording element substrate are electrically interconnected by bonding together an inner lead exposed from the electric wiring member to the device hole and an electric connection unit disposed in the recording element substrate.

Japanese Patent Application Laid-Open No. 2006-297753 discusses a method for achieving electric connection with connection strength suppressed for variance by setting almost equal the sums of areas of connected portions of the inner lead and the terminal when the inner lead and the electric connection unit are interconnected by a gang bonding method.

In the electric connection between the electric connection unit of the recording element substrate and the inner lead of the electric wiring member, to reduce wiring resistance of the electric wiring member, a wiring width of the electric wiring member can be set large. To reduce the wiring resistance, there is known a method for setting a base of the inner lead larger than a leading end of the inner lead exposed to the device hole of the electric wiring member. However, the large width of the base of the inner lead causes an increase in inner lead's own reaction, creating a possibility that failures will occur during bonding.

To reduce wiring resistance of a wiring tape and achieve good bonding, there is a method for reducing a width of the wiring in a portion in which no wiring of the electric wiring member is exposed to the device hole, namely, a region sandwiched between the base film and the cover film.

However, with miniaturization of the recording element substrate, a higher density of the wirings, and an increase in number of energy generation element, a current amount applied to each power line for driving the energy generation element tends to increase. Electric resistance then increases in a portion in which a width of the inner lead of the electric wiring member is small, causing heat to easily accumulate. Furthermore, the portion of the thin wiring in which heat easily accumulates is filled with heat more easily when it is sandwiched between the films which constitute the electric wiring member.

SUMMARY OF THE INVENTION

According to an aspect of the present invention, A liquid discharge head includes: a recording element substrate that includes a plurality of energy generation elements configured to generate energy used for discharging a liquid and a plurality of electric connection units electrically connected to the plurality of energy generation elements; and an electric wiring member that includes a plurality of input terminals electrically connectable to an external electric connection unit, a plurality wirings held between films and electrically connected to the plurality of input terminals, and a plurality of lead lines conducted to the plurality of wiring, extending to the outside from between the films, and electrically connected to the plurality of electric connection units. In this case, the plurality of wirings include a power line for supplying power to the energy generation elements and a signal line for supplying a signal to the energy generation elements. Relationships of A>B and B<D are satisfied, in which A is a largest width of the signal line, B is a largest width of the lead line connected to the signal line, and D is a largest width of the lead line connected to the power line.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1A:
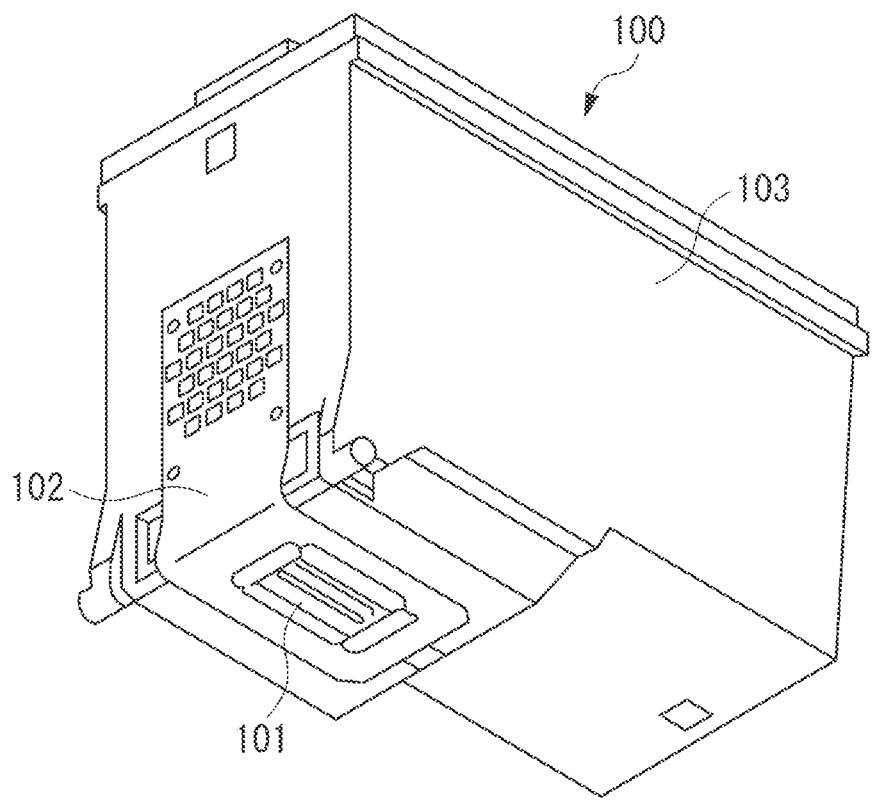
FIGS. 1A and 1B are perspective views illustrating a liquid discharge cartridge according to an exemplary embodiment of the present invention.
Figure 1B:
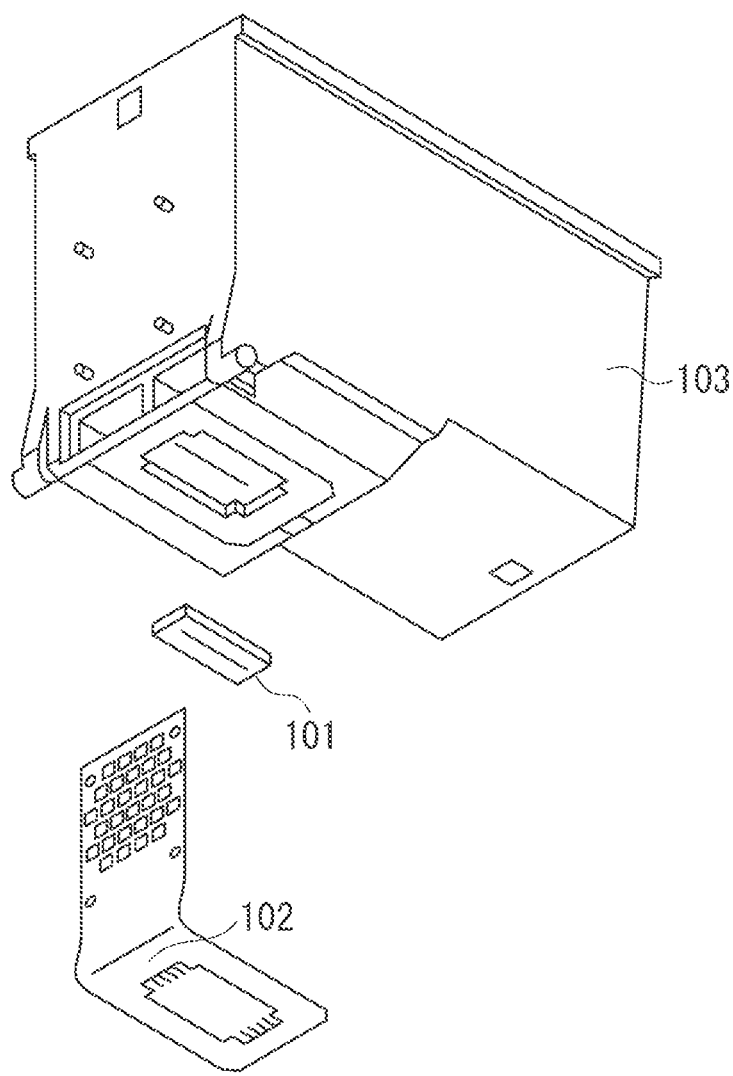
Figures 2A, 2B:
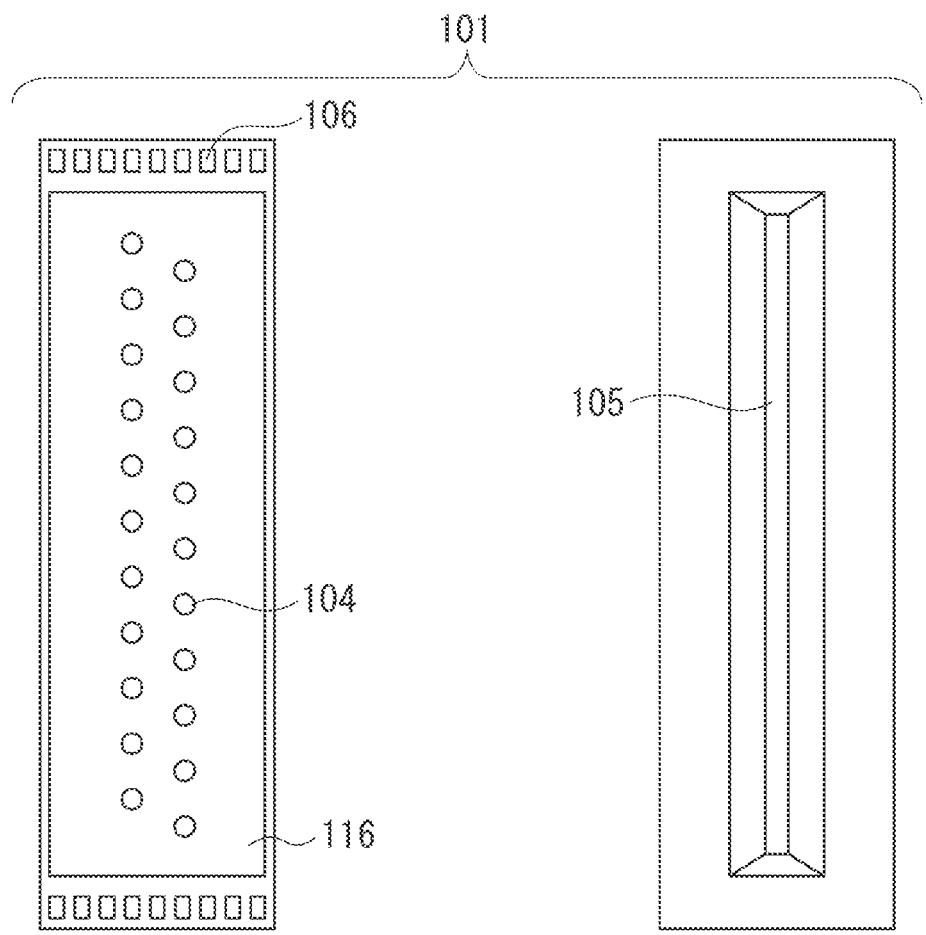
FIGS. 2A and 2B schematically illustrate a recording element substrate included in a liquid discharge head according to the exemplary embodiment of the present invention.
Figure 3:
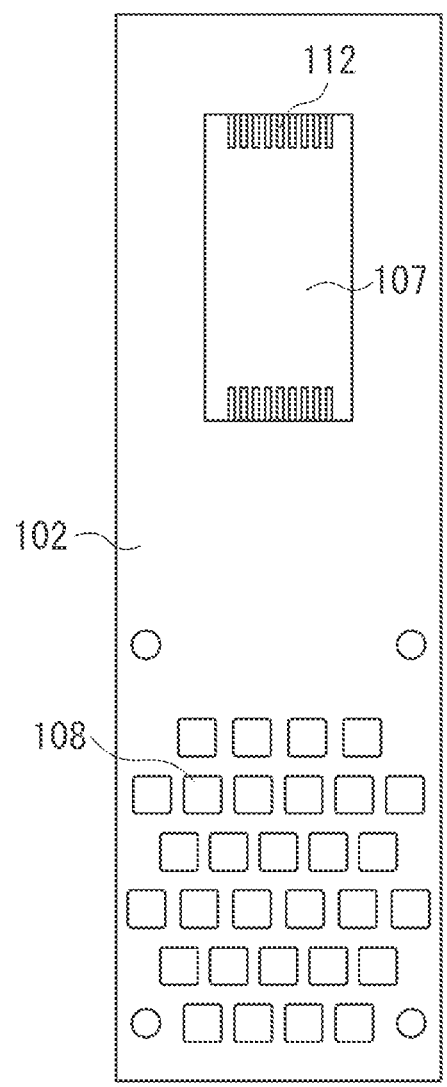
FIG. 3 schematically illustrates an electric wiring member included in the liquid discharge head according to the exemplary embodiment of the present invention.
Figure 4:
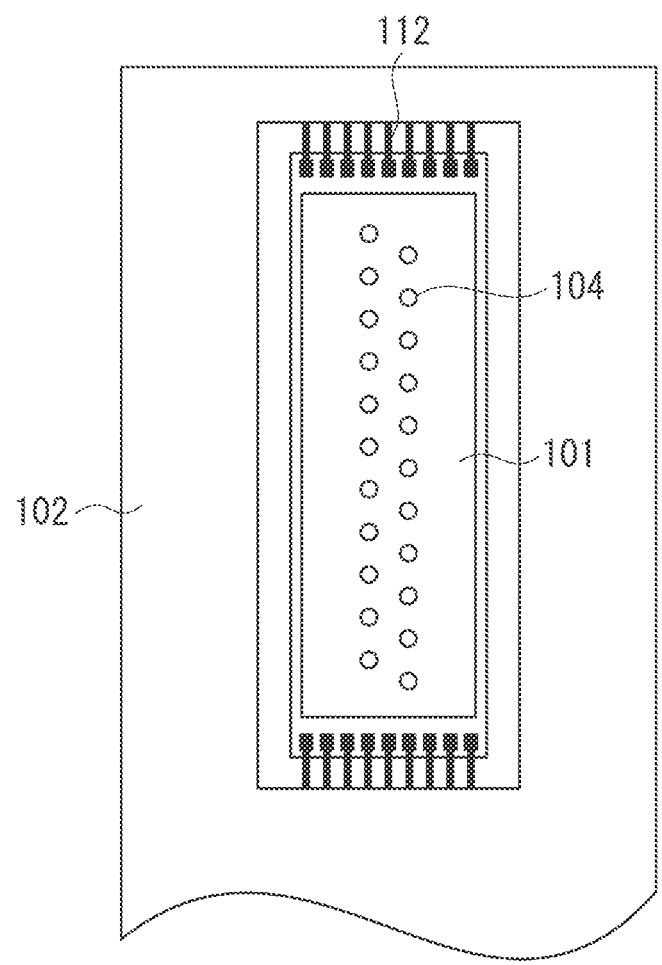
FIG. 4 schematically illustrates the recording element substrate and the electric wiring member included in the liquid discharge head according to the exemplary embodiment of the present invention.
Figure 5A:
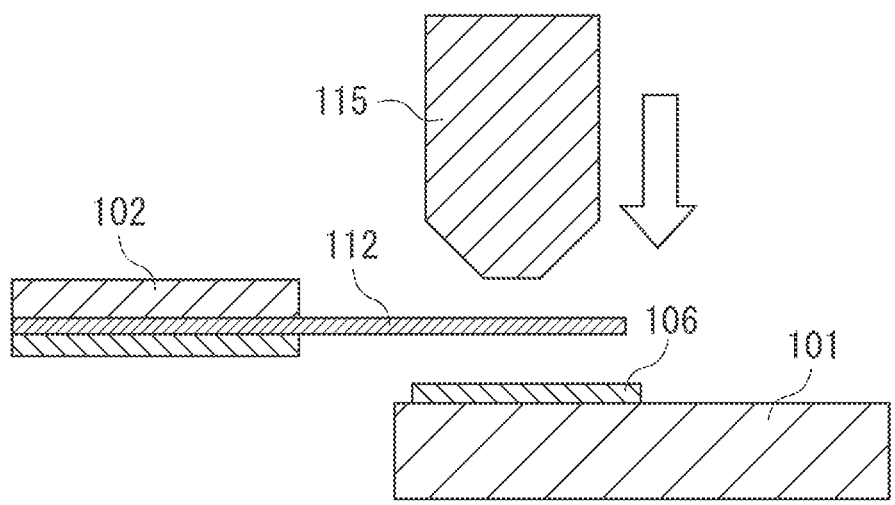
FIGS. 5A and 5B are sectional views illustrating the recording element substrate and the electric wiring member included in the liquid discharge head according to the exemplary embodiment of the present invention.
Figure 5B:
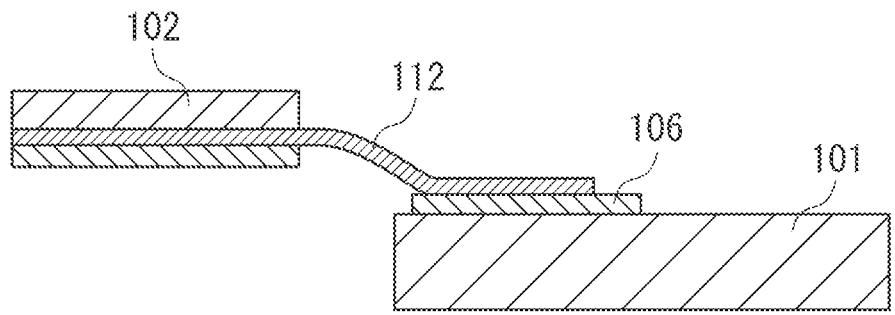

An exemplary embodiment of the present invention is described referring to the drawings. FIGS. 1A and 1B to FIGS. 5A and 5B illustrate a configuration of a liquid discharge head according to the exemplary embodiment of the present invention. FIG. 1A is a perspective view illustrating a liquid discharge cartridge 100 in which the liquid discharge head and an ink container 103 are integrally formed. FIG. 1B is an exploded perspective view illustrating a recording head. FIG. 2A is a plan view illustrating a front surface of a recording element substrate 101 included in the recording head. FIG. 2B is a plan view illustrating a rear surface of the recording element substrate 101. FIG. 3 is a plan view illustrating a surface of an electric wiring member 102 constituting a part of the recording head. FIG. 4 is a plan view illustrating a state where the recording element substrate 101 and the electric wiring member 102 are electrically connected. FIGS. 5A and 5B are explanatory sectional views illustrating a manufacturing process when the recording element substrate 101 and the electric wiring member 102 are electrically connected together.

According to the present exemplary embodiment, the recording element substrate 101 is a plate-shaped member made of a silicon (Si) material with a thickness of 0.625 millimeters. On one surface of the recording element substrate, a plurality of electrothermal conversion elements (not illustrated) serving as energy generation elements and electric wirings made of aluminum (Al) for supplying power to heaters that are each of the electrothermal conversion elements are formed by a film-forming technology. As illustrated in FIG. 2A, on a side of the surface of the recording element substrate 101 in which the electrothermal conversion elements are formed, a flow-path forming member 116 that includes a plurality of ink flow paths and a plurality of ink discharge ports 104 corresponding to the electrothermal conversion elements is formed by a photolithography technology.

On the recording element substrate 101, an ink supply port 105 for supplying ink to the plurality of ink flow paths is formed through the substrate. The electric wiring member 102 includes a device hole 107 that is an opening for installing the recording element substrate 101, and an inner lead 112 corresponding to an electric connection unit 106 connected to an electric wiring formed in the recording element substrate 101. A plurality of inner leads 112, which extend in the device hole, are arrayed in parallel in a predetermined direction.

The electric wiring member 102 also includes an input terminal 108 connected to an electric contact of an external recording apparatus body to receive a driving control signal from the recording apparatus. The input terminal 108 is formed connectable to the electric contact of the recording apparatus, and the input terminal 108 and the inner lead 112 that is a lead line are connected by a copper-foil wiring An example of the electric wiring member 102 is a tape formed by a tape automated bonding (TAB) method. As illustrated in FIGS. 5A and 5B, the electric wiring member 102 and the recording element substrate 101 are prepared and, by using a gang bonding tool 115, the inner leads 112 and the electric connection units of the recording element substrate 101 are thermally pressurized and crimped en bloc to be electrically connected. During bonding connection, the inner lead 112 is pushed and bent by the bonding tool to be electrically connected. Thus, the inner lead 112, when too strong itself, may be separated from the electric connection unit 106 after pressing of the bonding tool. Therefore the strength of the inner lead can be suppressed by setting small a width of the inner lead extending into the device hole. After the bonding connection, sealing material is applied to protect such connected portions from a liquid such as ink or an external force.

Figure 6A:
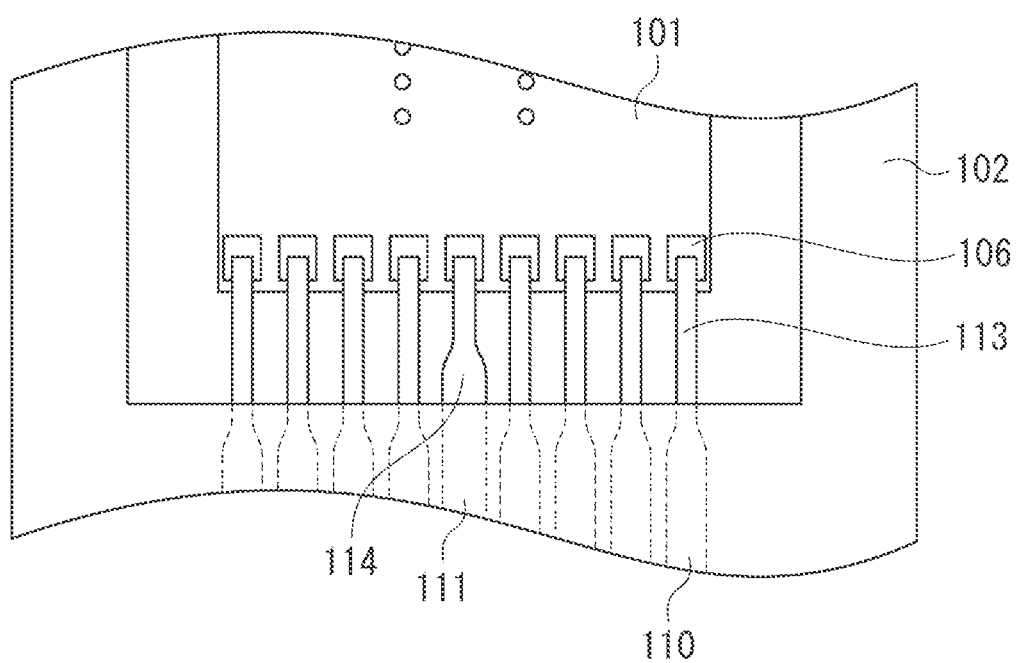
FIGS. 6A, 6B and 6C schematically illustrate a vicinity of a lead line portion of a liquid discharge head according to a first exemplary embodiment of the present invention.
Figure 6B:
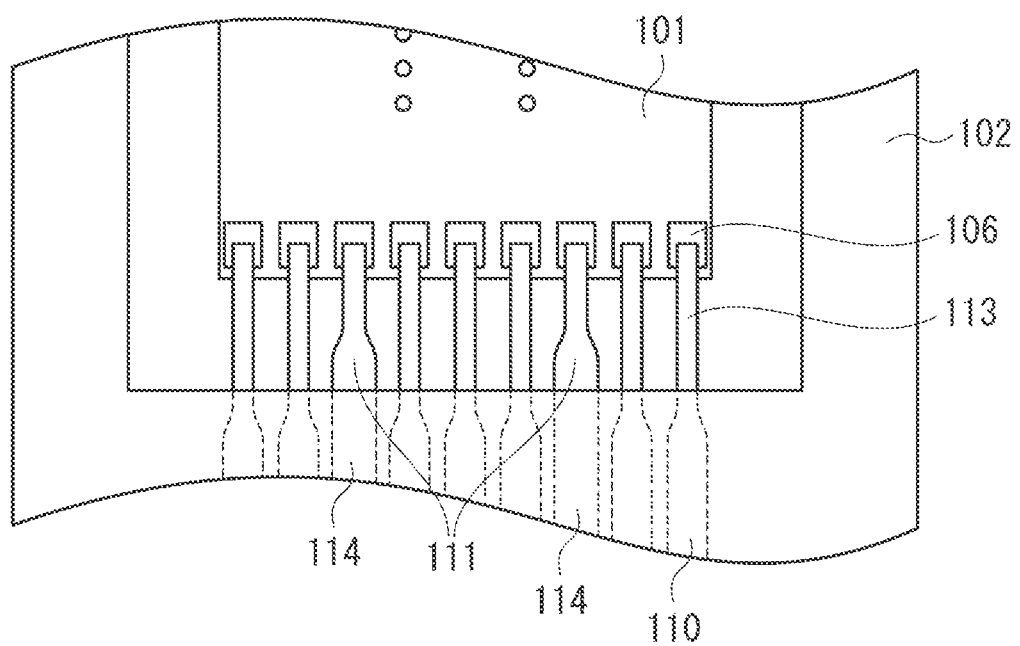
Figure 6C:
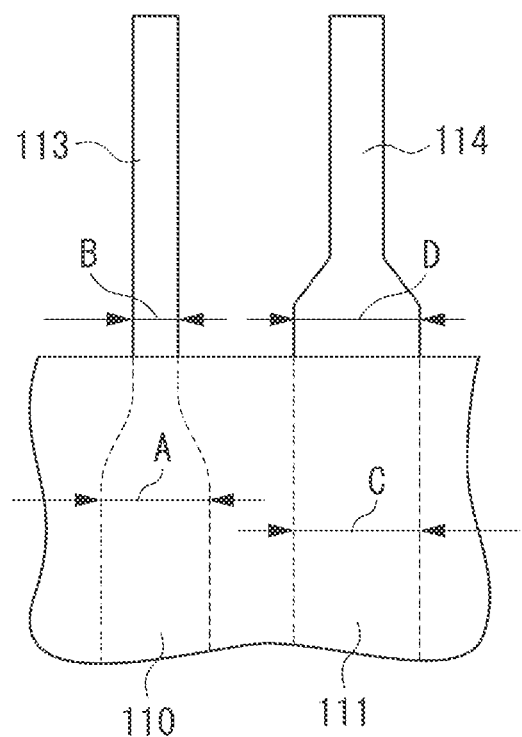

A first exemplary embodiment is described. FIGS. 6A to 6C are schematic views illustrating the vicinity of an inner lead of an electric wiring member 102 of a liquid discharge head according to the first exemplary embodiment. FIGS. 6A and 6B schematically illustrate an electrically connected state of a recording element substrate 101 and the electric wiring member 102 of the liquid discharge head. FIG. 6C is an expanded schematic view illustrating the electric wiring member 102 of the liquid discharge head. FIG. 6C illustrates a power line 111 for supplying power to an electrothermal conversion element (heater) that is an energy generation element for generating energy used to discharge a liquid, an inner lead 114 connected to the power line 111, a signal line 110 for supplying a signal to the heater, and an inner lead 113 connected to the signal line 110. The power line 111 includes a wiring (VH line) for supplying a relatively high reference voltage to the heater and a wiring (GND line) for supplying a relatively low reference voltage.

As illustrated in FIGS. 6A to 6C, the inner lead 14 connected to, among the wirings of the electric wiring member 102, the power line 111 for supplying power to the energy generation element, is formed into a shape such that a portion until a part exposed to a device hole of the electric wiring member is wider than a leading end of the inner lead 114. Setting many of portions of the wiring thick enables reduction of resistance of the wiring, realizing a form suitable when relatively large current flows through the power line. Forming a thin portion of the wiring in which heat easily accumulates from a part sandwiched between resin films of the electric wiring member 102 to the inner lead portion of the device hole enables exposure of this portion to the outside. As a result, current resistance or heat resistance can be increased.

In the case of the signal line 110 for supplying a signal to the energy generation element, a portion in which a wiring is thin is formed in a region sandwiched between films. This enables the wiring of the inner lead to be set thin. Thus, when the recording element substrate 101 and the electric wiring member 102 are gang-bonded, reaction of the inner lead can be reduced, thereby achieving stable connection without yielding to the reaction. According to the present invention, at least one of each of the power line, the signal line, and the inner lead satisfying such a condition is required to be installed.

Thus, shapes of the wirings are selected by placing importance on greater reduction of wiring resistance and suppression of heat accumulation in the case of the power line through which relatively large current flows, and reduction of reaction of the inner lead during the bonding connection in the case of the signal line. As a result, the reaction of the inner lead during the bonding can be reduced while reducing the wiring resistance of the power line and heat accumulated in the electric wiring member.

In the configuration illustrated in FIG. 6C, wirings are formed to satisfy conditions of A>B and B<D, where A is a wiring width at a widest part of the signal line 110 held between the resin films, B is a wiring width at the base of the inner lead 113 connected to the signal line 110, C is a wiring width at a widest part of the power line 111 sandwiched between the films, and D is a wiring width at the base of the inner lead 114 connected to the power line 111. This can achieve a wiring configuration with consideration given to an influence of heat, wiring resistance, and reaction during the bonding. Satisfying a condition of A≤C enables greater reduction of resistance of the power line through which current larger than that through the signal line flows.

According to the present exemplary embodiment, as illustrated in FIGS. 6A and 6B, the inner leads 114 of the power line 111 are arranged in positions, excluding ends of an array of the inner leads, to be almost symmetrical with each other in the array of the inner leads. This can achieve stable connection because reaction of the inner leads 112 can be balanced during gang bonding. Particularly, in FIG. 6A, the power line 111 and the inner lead 114 are located in a center region of the array of the inner leads, and a plurality of signal lines 110 and a plurality of inner leads 113 are located to be almost symmetrical on both sides thereof. Locating the inner lead 114 relatively high in strength in the center enables stable bonding by keeping good pressing balance during the gang bonding.

According to the present exemplary embodiment, among the power lines 111 including the VH lines and the GND lines, the power line 111 formed in a center region of an arraying direction is set as a VH line. Wiring resistance is reduced by dividing the GND line into two. The division of the GND line into two eliminates the necessity of each wiring to be approximately equal in thickness to the power line 111. In other words, a width of the GND line can be set about equal to that of the signal line. A width of the inner lead can accordingly be set small, thus reducing strength of the inner lead and wiring resistance.

Only the electric connection on one end side of the recording element substrate has been described. However the same electric connection form can be employed at the opposite end of the recording element substrate.

Figure 7A:
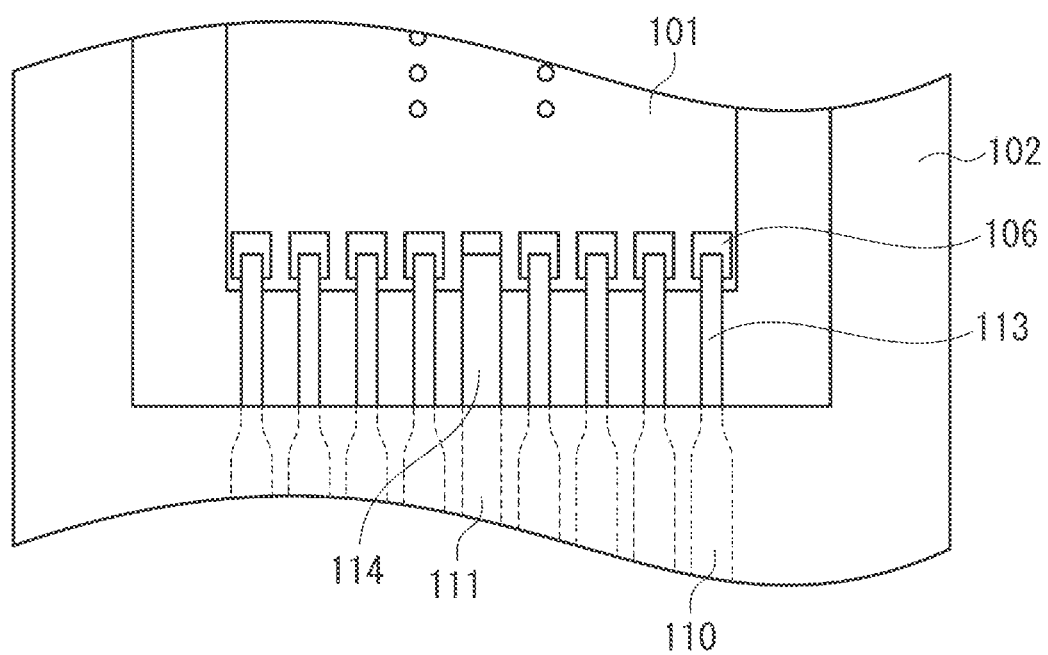
FIGS. 7A, 7B and 7C schematically illustrate a vicinity of a lead line portion of a liquid discharge head according to a second exemplary embodiment of the present invention.
Figure 7B:
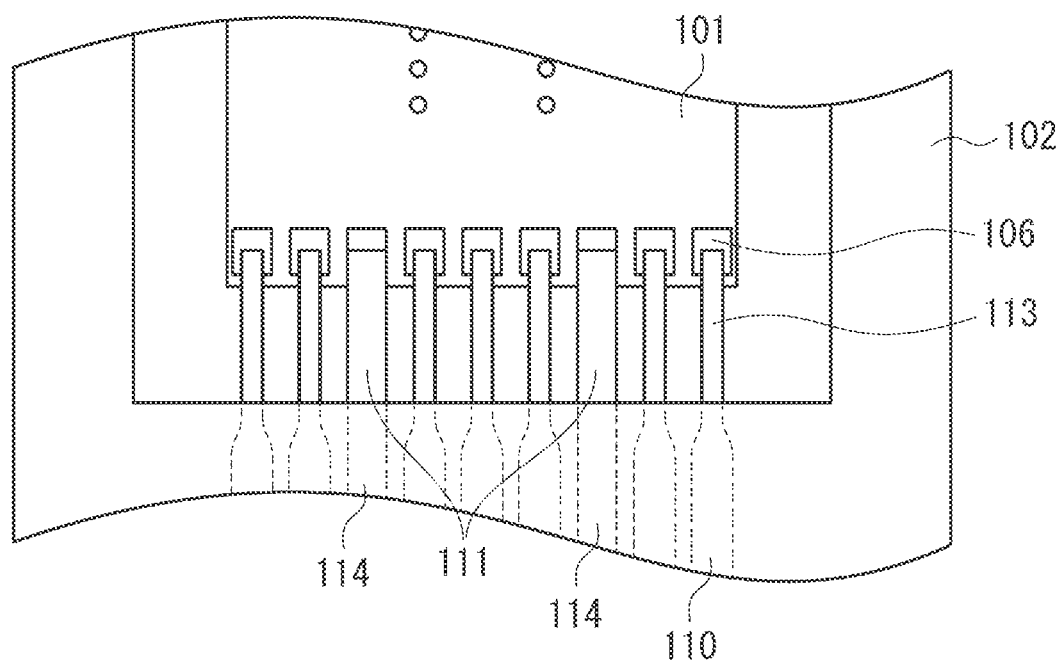
Figure 7C:
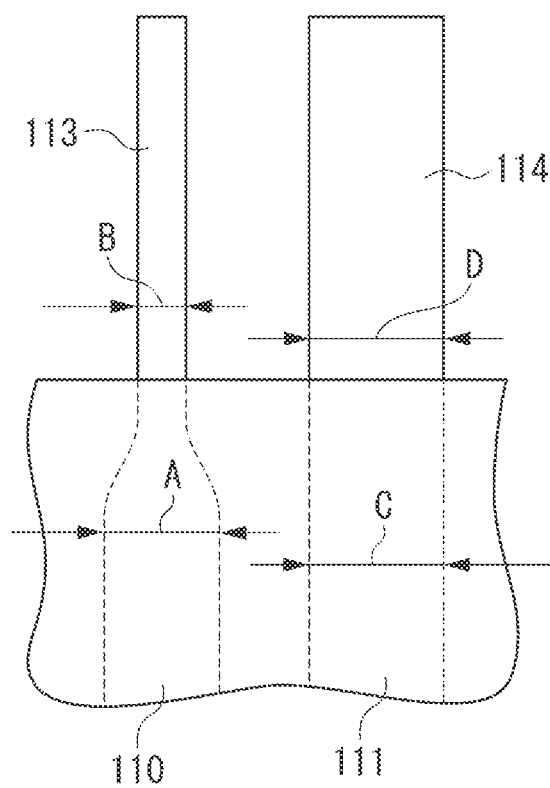

A second exemplary embodiment is described. FIGS. 7A to 7C are schematic views illustrating the vicinity of an inner lead 112 of an electric wiring member 102 of a liquid discharge head according to the second exemplary embodiment. FIGS. 7A and 7B schematically illustrate an electrically connected state of a recording element substrate 101 and the electric wiring member 102 of the liquid discharge head. FIG. 7C is an expanded schematic view illustrating the electric wiring member 102 of the liquid discharge head. FIG. 7C illustrates a power line 111 for driving an energy generation element to supply power to a heater, its inner lead 114, a signal line 110 for driving an energy generation element to supply a signal to the heater, and its inner lead 113. The power line 111 includes a wiring for applying a heat voltage, and a ground wiring of the heat voltage.

As illustrated in FIGS. 7A to 7C, the inner lead 14 connected to, among the wirings of the electric wiring member 102, the power line 111 for supplying power to the energy generation element, is formed into a shape such that a portion until a leading end of the inner lead 114 exposed to a device hole 107 of the electric wiring member 102 is wide. Specifically, as illustrated in FIG. 7C, relationships of A>B and B<D are satisfied, where A is a wiring width at a widest part of the signal line 110 sandwiched between resin films, B is a wiring width at a base of the inner lead 113 of the signal line 110, similarly C is a wiring width at a widest part of the power line 111 sandwiched between films, and D is a wiring width at a base of the inner lead 114 of the power line 111. This can achieve greater reduction of wiring resistance than that of the first exemplary embodiment even when relatively large current flows through the wirings. A larger wiring width of the inner lead 114 causes an increase in strength of the inner lead itself. However, stable bonding can be achieved by setting, as illustrated in FIGS. 7A to 7C, the number of power lines 111 to one to two, and locating the power line 111 in a center region of the inner lead array.

When there is space in the electric wiring member, by setting the wiring widths of the signal line 110 and its inner lead 113 to C>D, the wiring resistance can be reduced more. Each of the exemplary embodiments has been described by taking the example of the method for connecting the recording element substrate 101 and the inner lead 112 of the electric wiring member 102 by the gang bonding. However, the present invention can be applied even to a single bonding method for connecting each terminal. In the exemplary embodiments, the recording head and the ink container are integral. However, a method can be employed where the ink container is detachable from the recording head.

The exemplary embodiments are in no way limitative of the present invention. The components of the exemplary embodiments can be appropriately combined, and changed within a scope specified in appended claims.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. An electric wiring member to be electrically connected to a member including a plurality of elements and a plurality of electric connection units, the electric wiring member comprising:
    a plurality of wirings sandwiched between films; and
    a plurality of lead lines conducted to the plurality of wirings, extending to the outside from between the films, and electrically connected to the plurality of electric connection units,
    wherein the plurality of wirings is configured to include a power line for supplying power to the elements and a signal line for supplying a signal to the elements, and configured to satisfy relationships of A>B and B<D, in which A is a largest width of the signal line between the films, B is a largest width of the lead line connected to the signal line, and D is a largest width of the lead line connected to the power line.

2. The electric wiring member according to claim 1, wherein a relationship of A≤C is satisfied, in which C is a largest width of the power line between the films.

3. The electric wiring member according to claim 1, wherein a width of a base of the lead line connected to the power line is configured to be larger than that of a leading end of the lead line.

4. The electric wiring member according to claim 1, wherein the plurality of wirings is configured to be arrayed in parallel in a predetermined direction, and
wherein the power lines are configured to be formed in positions excluding ends of the array.

5. The electric wiring member according to claim 4, wherein the power line is configured to be formed in a center of the array.

* * * * *